United States Patent
Hudson et al.

(10) Patent No.: US 10,202,051 B2
(45) Date of Patent: Feb. 12, 2019

(54) SPEED CONTROL FOR BACK-DRIVE POWER ACTUATOR

(71) Applicant: LEAR CORPORATION, Southfield, MI (US)

(72) Inventors: Curtis Hudson, Macomb, MI (US); Craig Elder, Plymouth, MI (US); Mark R. Keyser, Lake Orion, MI (US)

(73) Assignee: LEAR CORPORATION, Southfield, MI (US)

( * ) Notice: Subject to any disclaimer, the term of this patent is extended or adjusted under 35 U.S.C. 154(b) by 0 days.

(21) Appl. No.: 15/643,878

(22) Filed: Jul. 7, 2017

(65) Prior Publication Data

US 2019/0009696 A1    Jan. 10, 2019

(51) Int. Cl.
| | |
|---|---|
| *H02P 1/54* | (2006.01) |
| *B60N 2/06* | (2006.01) |
| *B60N 2/225* | (2006.01) |
| *H01L 29/866* | (2006.01) |
| *B60N 2/02* | (2006.01) |

(52) U.S. Cl.
CPC ........... *B60N 2/067* (2013.01); *B60N 2/2255* (2013.01); *H01L 29/866* (2013.01); *B60N 2/0232* (2013.01); *B60N 2002/024* (2013.01)

(58) Field of Classification Search
CPC .......... H02P 7/288; B60N 2/0232; B60N 2/06
See application file for complete search history.

(56) References Cited

U.S. PATENT DOCUMENTS

| | | | | |
|---|---|---|---|---|
| 3,731,880 A | * | 5/1973 | Williams | ........... F02M 51/0632 239/585.1 |
| 4,284,935 A | | 8/1981 | March et al. | |
| 5,079,608 A | * | 1/1992 | Wodarczyk | ......... H01L 27/0251 257/355 |
| 7,239,096 B2 | | 7/2007 | Hancock et al. | |
| 2016/0090011 A1 | * | 3/2016 | Stutika | ..................... B60N 2/12 248/429 |

FOREIGN PATENT DOCUMENTS

CN            105358368           2/2016

* cited by examiner

*Primary Examiner* — Karen Masih
(74) *Attorney, Agent, or Firm* — Brooks Kushman P.C.

(57) ABSTRACT

A back-drive speed control system for incorporation into an actuated vehicle seating system includes an actuator having a permanent magnet and a coil that can move relative to each other to create a voltage across a first terminal and a second terminal. The actuator is adapted to move a linkage in an actuated vehicle seating system. A biasing member moves one or both of the permanent magnet and the coil such that the first terminal has a positive potential relative to the second terminal. The back-drive speed control system further includes a first diode and a Zener diode in series connected across the first terminal and the second terminal such that the forward current direction of the first diode is oriented in the opposite direction to the forward current direction of the Zener diode.

20 Claims, 4 Drawing Sheets

SPEED CONTROL FOR BACK-DRIVE POWER ACTUATOR

TECHNICAL FIELD

In at least one aspect, the present invention is related to actuators used to move vehicle seats.

BACKGROUND

Power actuators are motor/gear driven assemblies that pull cables which typically unlock and release locking mechanisms, and thereby allow a portion of a seat system to move/rotate. The actuators are mechanically back-driven to their initial starting positions, typically with a spring. A drawback to this approach is that the back-drive spring makes the motor and gears rotate quickly in reverse direction, producing a whining sound during return and a noticeably loud click when the gears reach their travel stop. More significantly perhaps is that the gear train is subjected to very high impact loading, and the gear teeth are vulnerable to fracture. To protect the gear train and minimize the clicking sound, rubber bumper stops are sometimes used. But the reverse whining sound is still present, and the bumpers are added expense. Return time is typically ½ second. A standard solution which places a diode across the motor terminals eliminates motor whine and gear tooth impact loading results in an undesirably long return time (~5 seconds).

Accordingly, there is a need for improved vehicle seat actuators with improved sound and time performance.

SUMMARY

The present invention solves one or more problems of the prior art by providing, in at least one embodiment, a back-drive speed control system for incorporation into an actuated vehicle seating system. The back-drive speed control system includes an actuator having a permanent magnet and a coil that can move relative to each other to create a voltage across a first terminal and a second terminal. The actuator is adapted to move a linkage in an actuated vehicle seating system. A biasing member moves one or both of the permanent magnet and the coil such that the first terminal has a positive potential relative to the second terminal. The back-drive speed control system further includes a first diode and a Zener diode in series with the first diode. The series configuration of the first diode and the Zener diode are connected across the first terminal and the second terminal such that the forward current direction of the first diode is oriented in the opposite direction to the forward current direction of the Zener diode. Characteristically, the Zener diode has a Zener voltage such that a time response of the actuator is less than a predetermined time duration.

In another embodiment, an actuated vehicle seating system incorporating the back-drive speed control system set forth above is provided. The actuated vehicle seating system includes a first track to be fixed to a vehicle, a second track movably attached to the first track, a vehicle seat attached to the second track, a linkage in communication with the second track, and a vehicle seat actuator assembly that moves the linkage such that the vehicle seat moves with respect to the first track. Advantageously, the vehicle actuator assembly includes the back-drive speed control system set forth above.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

Throughout this application, where publications are referenced, the disclosures of these publications in their entireties are hereby incorporated by reference into this application to more fully describe the state of the art to which this invention pertains.

Figure 1A:
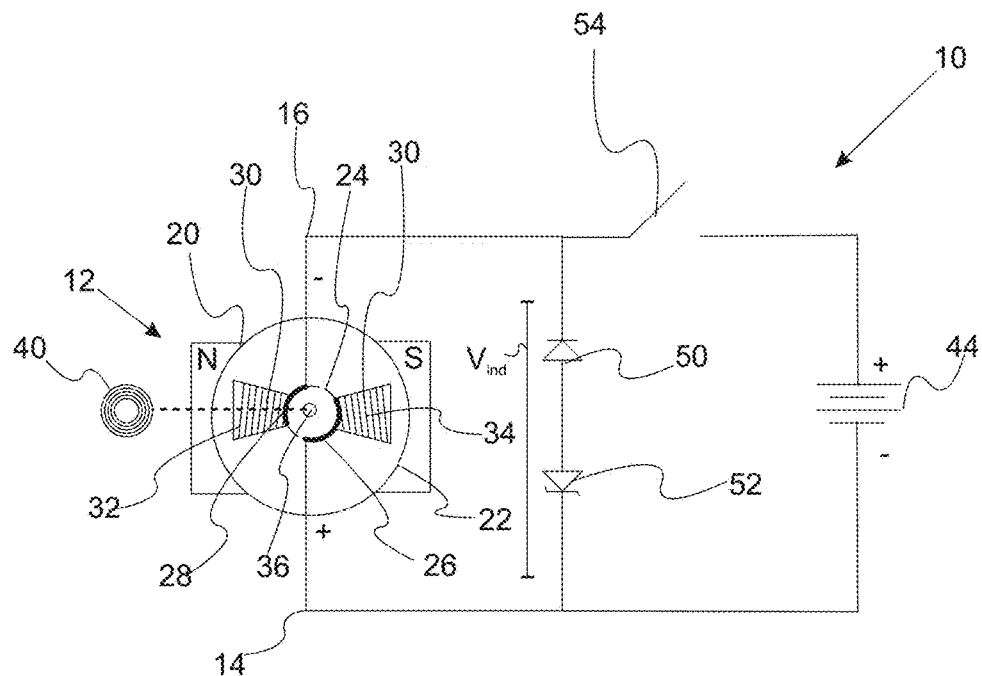
FIG. 1A is a schematic illustration of a back-drive speed control system for incorporating into an actuated vehicle seating system.
Figure 1B:
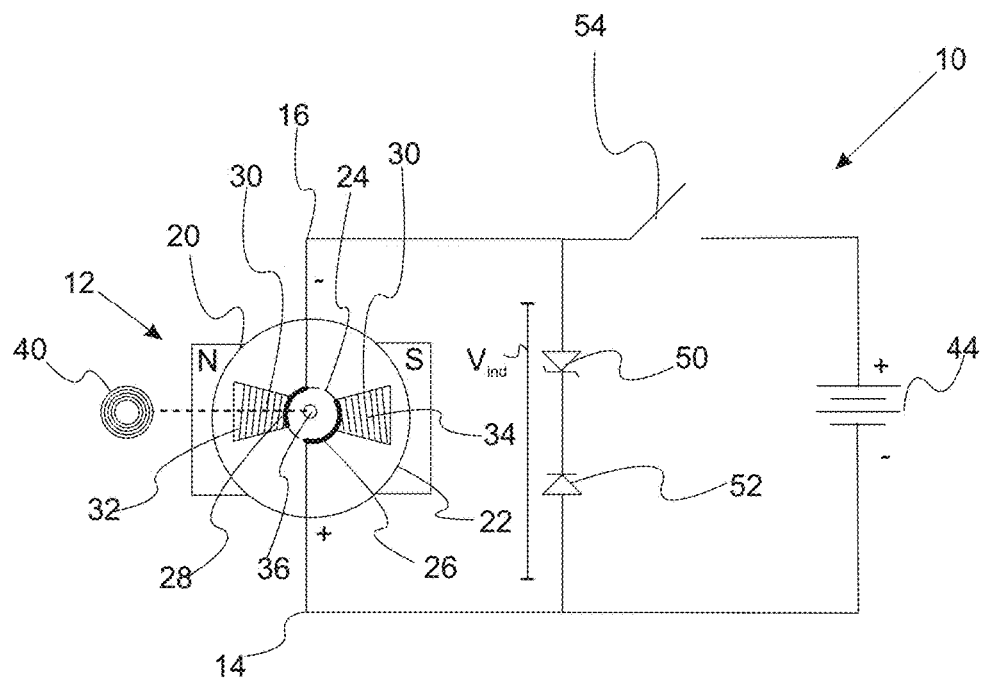
FIG. 1B is a schematic illustration of a back-drive speed control system for incorporating into an actuated vehicle seating system.

With reference to FIGS. 1A and 1B, schematic illustrations of a back-drive speed control system for incorporating into an actuated vehicle seating system is provided. Back-drive speed control system 10 includes actuator 12. Typically, actuator 12 includes a permanent magnet and a coil that can move relative to each other to create a voltage across a first terminal 14 and a second terminal 16. FIGS. 1A and 1B depict an actuator that is an electrical motor, and in particular, a DC motor. Therefore, actuator 12 includes magnet 20, stator 22, commutator 24, and brushes 26, 28. Rotator 30 has coils 32, 34 wound thereon. Rotator 30 rotates within stator 22 about axle 36. In some variations, actuator 12 can be an AC motor. Back-drive speed control system 10 can also include biasing member 40 that moves one or both of the permanent magnet and the coil such that the first terminal has a positive potential relative to the second terminal. Voltage source 44 (e.g., a battery) is used for the normal operation of actuator 12. When actuator 12 is a DC motor, biasing member 40 rotors rotator 30 in a direction that is opposite to the motion that voltage source 44 induces in actuator 12.

Still referring to FIGS. 1A and 1B, back-drive speed control system 10 includes a first diode 50 and a Zener diode 52. In a refinement, first diode 50 is a standard (i.e., a non-Zener diode) diode. For example, diode 50 can be a p-n p-n junction diode. Zener diode 52 is in series with the first diode 50 across the first terminal 14 and the second terminal 16 such that the forward current direction of the first diode is oriented in the opposite direction to the forward current direction of the Zener diode. In a refinement, the anode of first diode 50 is in direct electrical communication with the anode of Zener diode 52. In particular, the anode of first diode 50 is electrically closer to the anode of Zener diode 52 than to the cathode of Zener diode 52. The voltage $V_{ind}$ has a polarity such that the Zener diode is reversed biased and the first diode is forward biased. FIG. 1A illustrates a variation in which Zener diode 52 is electrically closer to the first terminal than first diode 50. FIG. 1B illustrates a variation in which first diode 50 is electrically closer to the first terminal than Zener diode 52.

Characteristically, Zener diode 52 has a Zener voltage such that a time response of the actuator is less than a predetermined value (i.e., time duration). In this context, the term "time response" means the time duration during which biasing member 40 induces movement of the permanent magnet and/or the coil. In a refinement, the time response is less than 5 seconds. In another refinement, the time response is less than 3, 2, or 1 seconds and greater than 0.5, 1 or 1.5 seconds. In another refinement, the response time is from 1 to 3 seconds. In a refinement, the Zener voltage is from about 3 to 6 volts at currents from about 200 to 400 mA. In another refinement, the Zener voltage is from about 3 to 5 volts at currents from about 200 to 400 mA. Table 1 provides parameters for Zener diodes that can be used in the embodiments of the invention:

TABLE 1

Zener Diode electrical characteristics a temperature of 25° C.

| Device (Note 2) | Device Marking | Zener Voltage Vz (Volts) | | | @IzT mA |
|---|---|---|---|---|---|
| | | Min | Nom | Max | |
| 1N5333B | 1N5333B | 3.14 | 3.3 | 3.47 | 380 |
| 1N5334B | 1N5334B | 3.42 | 3.6 | 3.78 | 350 |
| 1N5335B | IN5335B | 3.71 | 3.9 | 4.10 | 320 |
| 1N5336B | IN336B | 4.09 | 4.3 | 4.52 | 290 |
| 1N5337B | 1N337B | 4.47 | 4.7 | 4.94 | 260 |
| 1N5338B | 1N5338B | 4.85 | 5.1 | 5.36 | 240 |

Figure 2:
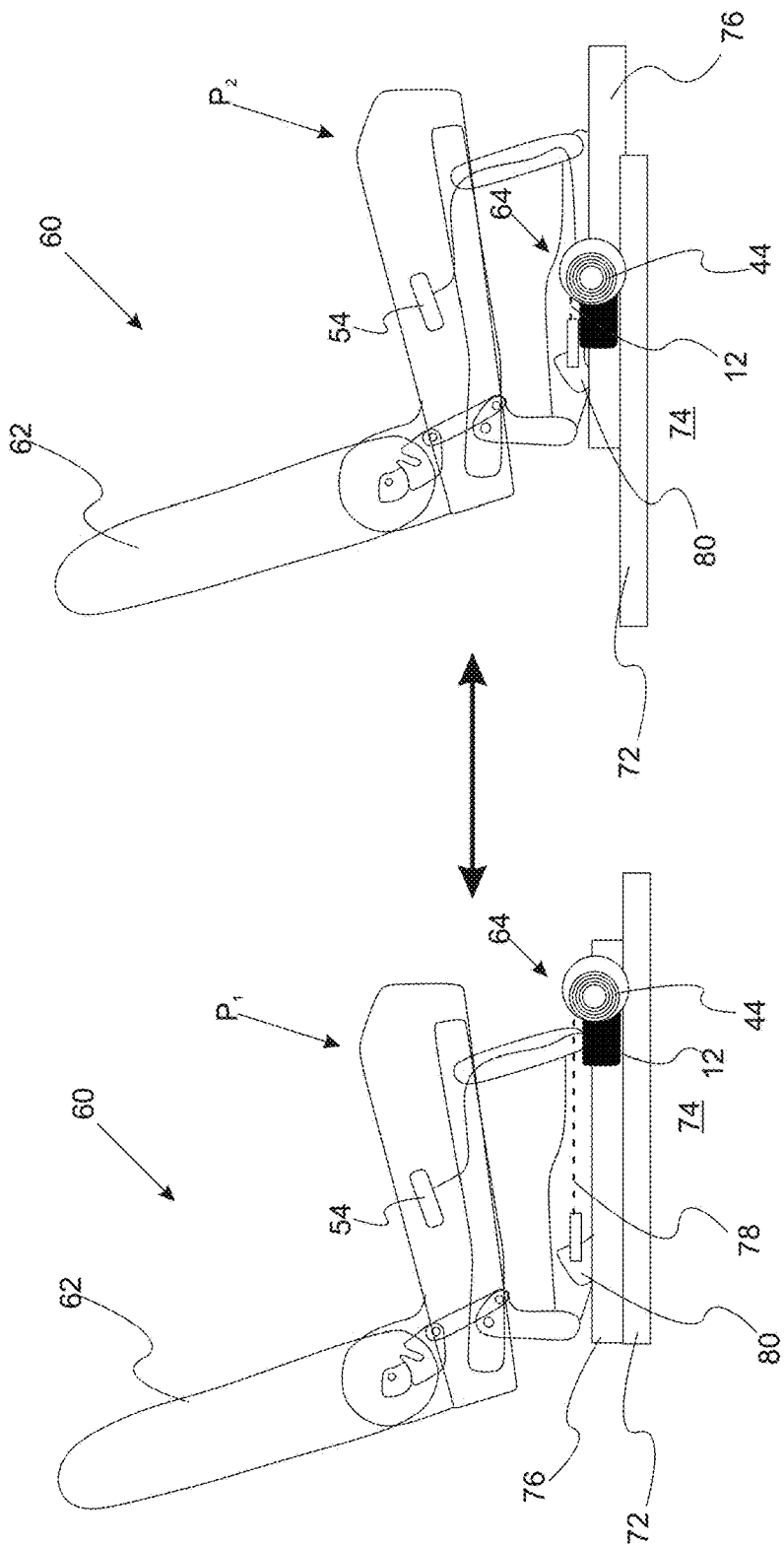
FIG. 2 is a schematic illustration of an actuated vehicle seating system incorporating the back-drive speed control system of FIGS. 1A and 1B FIG. 3A provides the return time for a DC motor without any diodes.

With reference to FIG. 2, a schematic illustration of an actuated vehicle seating system incorporating the back-drive speed control system of FIGS. 1A and 1B is provided. Vehicle seat actuation system 60 includes vehicle seat 62 which can move between a rear position $P_1$ to a forward position $P_2$ using vehicle seat actuator assembly 64. Actuated vehicle seating system 60 includes a first track 72 to be fixed to a vehicle (e.g., vehicle floor 74). Second track 76 is movably attached to the first track 72. Vehicle seat 62 is attached to the second track. Vehicle seat actuator assembly 64 includes back-drive speed control system 10. Advantageously, the design of the back-drive speed control system is set forth above in connection with the descriptions of FIGS. 1A and 1B. Actuator 12 is fixed to the first track 72 while being able to move the second track 76 relative to the first track when actuated via linkage 78 (e.g., a cable) which is fixed relative to a vehicle seat component 80. In particular, actuator 12 when actuated pulls actuation linkage 78 such that vehicle seat 62 moves from a first position $P_1$ to a second position $P_2$. Biasing member 40 acts to return vehicle seat 62 when a user initials a return procedure, i.e., vehicle seat moves from second position $P_2$ to first position $P_1$. It is during this return process when components of actuator 12 moves in a manner that induces a voltage as set forth above. During return, the induced voltage has an opposite polarity to the voltage applied from voltage source 44 to move the vehicle seat from position $P_1$ to $P_2$. Diode 14 is in series with Zener diode 16 with this series configuration placed across the terminals of motor 12. Advantageously, motor whine and gear tooth impact loading are eliminated while achieving a return time that is 4 seconds or less.

Figure 3A:
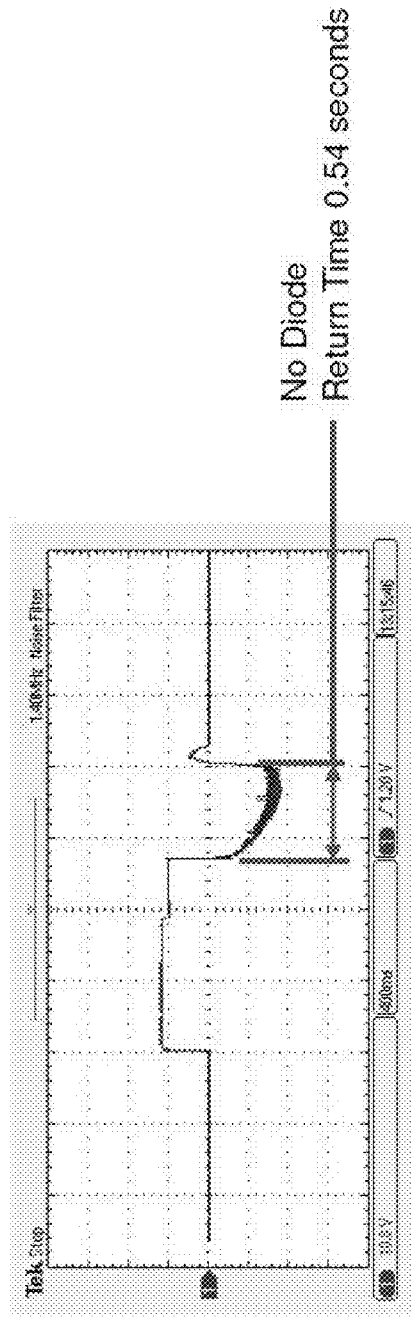
FIG. 3B provides the return time for a DC motor with two standard diodes in series across the motor terminals. The return time in this example is observed to be about 3.85 seconds.
FIG. 3C provides the return time for a DC motor with a standard diode and a Zener diode in series with opposite polarities across the motor terminals.
Figure 3B:
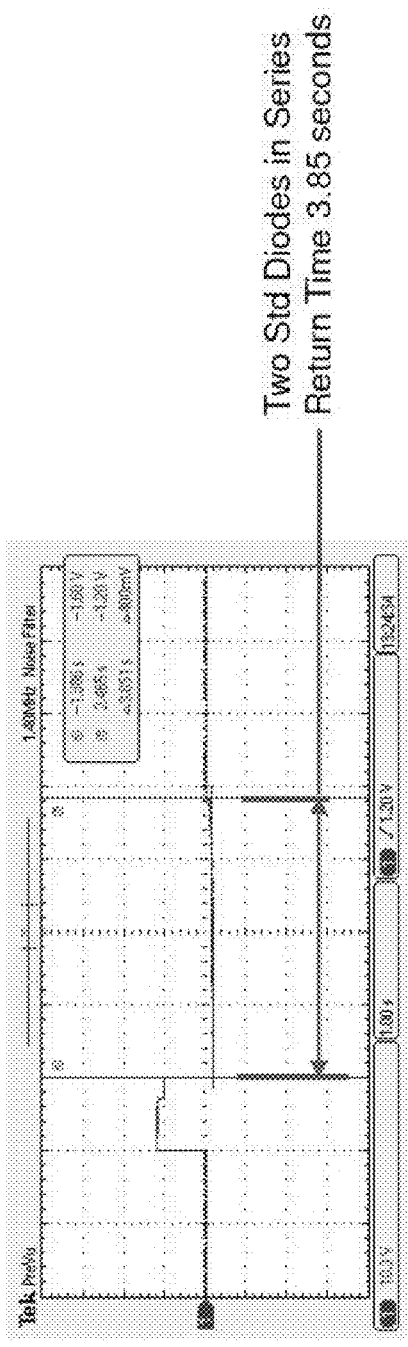
Figure 3C:
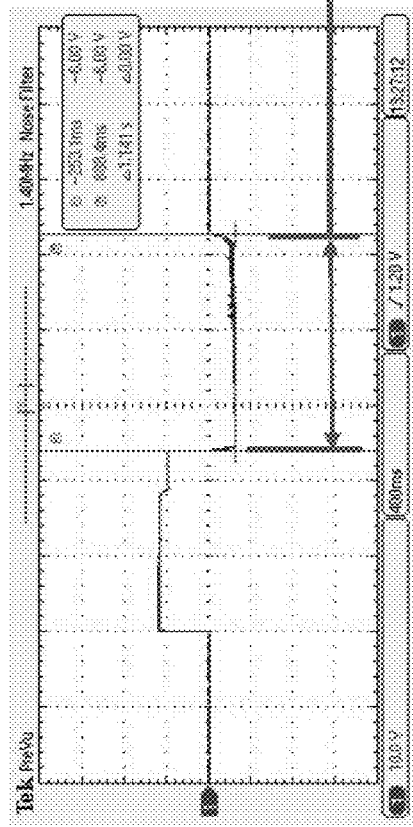
Figure 4:
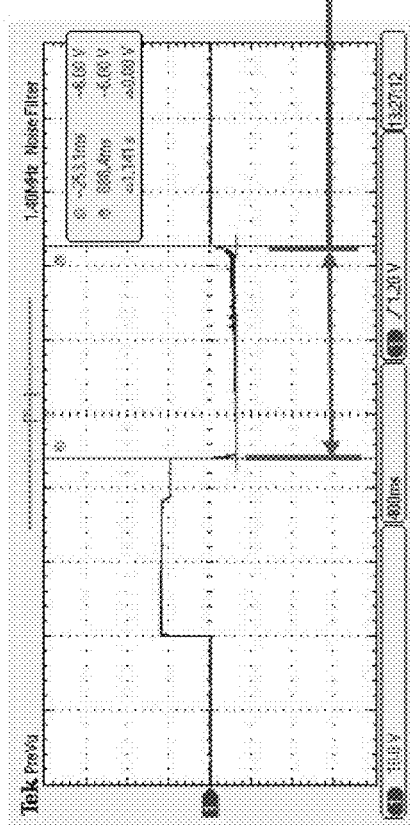
FIG. 4 provides an optimized return time for a DC motor with a standard diode and a Zener diode in series with opposite polarities across the motor terminals.

FIG. 3A provides the time response (i.e., return time) for a DC motor without any diodes. The return time in this example is observed to be about 0.54 seconds. FIG. 3B provides the time response for a DC motor with two standard diodes in series across the motor terminals. The return time in this example is observed to be about 3.85 seconds. FIG. 3C provides the time response for a DC motor with a standard diode and a Zener diode (i.e., a 1N5338B semiconductor diode) in series with opposite polarities across the motor terminals. The return time in this example is observed to be about 1.14 seconds. FIG. 4 provides an optimized time response for a DC motor with a standard diode and a Zener diode (i.e., a 1N5335B semiconductor diode) in series with opposite polarities across the motor terminals. The return time in this example is observed to be about 1.14 seconds.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A back-drive speed control system comprising:
   an actuator having a permanent magnet and a coil that can move relative to each other to create a voltage across a first terminal and a second terminal, the actuator adapted to move a linkage in an actuated vehicle seating system;
   a biasing member that moves one or both of the permanent magnet and the coil such that the first terminal has a positive potential relative to the second terminal,
   a first diode; and
   a Zener diode in series with the first diode across the first terminal and the second terminal such that a forward current direction of the first diode is oriented in an opposite direction to the forward current direction of the Zener diode, the Zener diode having a Zener voltage such that a time response of the actuator is less than a predetermined time duration.

2. The back-drive speed control system of claim 1 wherein the time response is less than 5 seconds.

3. The back-drive speed control system of claim 1 wherein the time response is from 1 to 3 seconds.

4. The back-drive speed control system of claim 1 wherein the actuator is an electrical motor.

5. The back-drive speed control system of claim 1 wherein the actuator is a DC motor.

6. The back-drive speed control system of claim 1 wherein the time response is a return time for a vehicle seat to move from a forward position to a design position.

7. The back-drive speed control system of claim 1 wherein the voltage has a polarity such that the Zener diode is reversed biased and the first diode is forward biased.

8. The back-drive speed control system of claim 1 wherein the Zener diode is electrically closer to the first terminal than the first diode.

9. The back-drive speed control system of claim 1 wherein the first diode is electrically closer to the first terminal than the Zener diode.

10. The back-drive speed control system of claim 1 further comprising a voltage source for operating the actuator.

11. The back-drive speed control system of claim 1 further comprising a voltage source for operating the actuator.

12. An actuated vehicle seating system comprising:
a first track to be fixed to a vehicle;
a second track movably attached to the first track;
a vehicle seat attached to the second track;
a linkage in communication with the second track; and
a vehicle seat actuator assembly that moves the linkage such that the vehicle seat moves with respect to the first track, the vehicle seat actuator assembly including a back-drive speed control system that includes:
an actuator having a permanent magnet and a coil that can move relative to each other to create a voltage across a first terminal and a second terminal, the actuator adaptable for moving the linkage;
a biasing member that moves one or both of the permanent magnet and the coil such that the first terminal has a positive potential relative to the second terminal,
a first diode; and
a Zener diode in series with the first diode across the first terminal and the second terminal such that a forward current direction of the first diode is oriented in an opposite direction to the forward current direction of the Zener diode, the Zener diode having a Zener voltage such that a return time of the actuator is less than a predetermined time duration.

13. The actuated vehicle seating system of claim 12 wherein the linkage is a cable.

14. The actuated vehicle seating system of claim 12 wherein the return time is less than 5 seconds.

15. The actuated vehicle seating system of claim 12 wherein the return time is from 1 to 3 seconds.

16. The actuated vehicle seating system of claim 12 wherein the actuator is an electrical motor.

17. The actuated vehicle seating system of claim 12 wherein the actuator is a DC motor.

18. The actuated vehicle seating system of claim 12 wherein the voltage has a polarity such that the Zener diode is reversed biased and the first diode is forward biased.

19. The back-drive speed control system of claim 12 wherein the Zener diode is electrically closer to the first terminal than the first diode.

20. The back-drive speed control system of claim 12 wherein the first diode is electrically closer to the first terminal than the Zener diode.

* * * * *